(12) United States Patent
Roy et al.

(10) Patent No.: US 9,147,495 B2
(45) Date of Patent: Sep. 29, 2015

(54) TWO-BIT READ-ONLY MEMORY CELL

(71) Applicant: LSI Corporation, San Jose, CA (US)

(72) Inventors: Rajiv Kumar Roy, Bangalore (IN);
Vikash, Bangalore (IN)

(73) Assignee: AVAGO TECHNOLOGIES GENERAL IP (SINGAPORE) PTE. LTD., Singapore (SG)

(*) Notice: Subject to any disclaimer, the term of this patent is extended or adjusted under 35 U.S.C. 154(b) by 0 days.

(21) Appl. No.: 13/778,258

(22) Filed: Feb. 27, 2013

(65) Prior Publication Data

US 2014/0241028 A1  Aug. 28, 2014

(51) Int. Cl.
*G11C 11/4097* (2006.01)
*G11C 17/14* (2006.01)
*G11C 11/56* (2006.01)

(52) U.S. Cl.
CPC .......... *G11C 17/146* (2013.01); *G11C 11/4097* (2013.01); *G11C 11/5692* (2013.01)

(58) Field of Classification Search
CPC ......... G11C 7/08; G11C 11/097; H01L 27/01
USPC ...................... 365/72, 63, 154, 104
See application file for complete search history.

(56) References Cited

U.S. PATENT DOCUMENTS

| | | | |
|---|---|---|---|
| 6,128,218 A * | 10/2000 | You et al. | 365/156 |
| 6,850,427 B1 | 2/2005 | Prestwich | |
| 7,215,563 B2 * | 5/2007 | Brandon et al. | 365/94 |
| 8,120,939 B2 | 2/2012 | Liaw | |
| 2008/0170430 A1 * | 7/2008 | Miller et al. | 365/156 |
| 2012/0163064 A1 * | 6/2012 | Jain et al. | 365/104 |

* cited by examiner

*Primary Examiner* — Shawski S Ismail
*Assistant Examiner* — Muhammad Islam
(74) *Attorney, Agent, or Firm* — Sheridan Ross P.C.

(57) ABSTRACT

A read-only memory (ROM) cell has first and second transistors connected in series between a true bit line and a voltage reference (e.g., ground), and third and fourth transistors connected in series between a complement bit line and the voltage reference. The gates of the first and third transistors are connected to a first word line, and the gates of the second and fourth transistors are connected to a second word line. The ROM cell is programmed to store any possible combination of two bits of information by appropriately (i) connecting the node between the first and second transistors to either the true bit line, the complement bit line, or the voltage reference and (ii) connecting the node between the third and fourth transistors to either the true bit line, the complement bit line, or the voltage reference.

20 Claims, 6 Drawing Sheets

TWO-BIT READ-ONLY MEMORY CELL

BACKGROUND OF THE INVENTION

1. Field of the Invention

The present invention relates to the storage of data, and, more specifically but not exclusively, to read-only memory (ROM) devices.

2. Description of the Related Art

Read-only memory (ROM) is a type of storage medium used in computers and other electronic devices. In general, data stored in ROM is either unchangeable or requires a special operation to change (unlike random-access memory (RAM), which can be changed as easily as it is read). Conventionally, ROM is configured as an array of memory cells, wherein the memory cells are arranged in rows and columns, and each memory cell stores a single bit of information (i.e., a logic state of "0" or "1").

BRIEF DESCRIPTION OF THE DRAWINGS

Embodiments of the disclosure will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Figure 1:
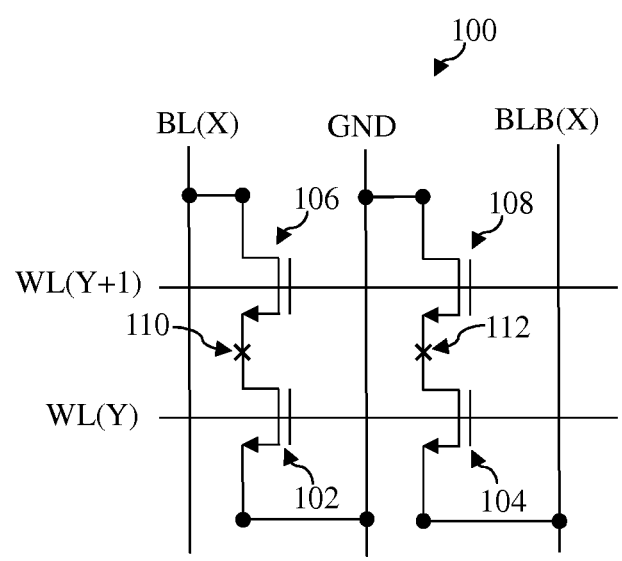
FIG. 1 shows a simplified schematic diagram of a read-only memory (ROM) cell according to one embodiment of the disclosure.

FIG. 1 shows a simplified schematic diagram of a read-only memory (ROM) cell 100 according to one embodiment of the disclosure. ROM cell 100, which may be implemented in an array of memory cells arranged in rows and columns, comprises four n-type transistors 102-108 that are configurable to store a pair of bits. The channels of transistors 102 and 106 are connected in series between a true bit line BL(X) in the $X^{th}$ column of the memory array and ground. In particular, the source of transistor 102 is coupled to ground, the drain of transistor 102 is coupled to the source of transistor 106 at node 110, and the drain of transistor 106 is coupled to the true bit line BL(X). Similarly, the channels of transistors 104 and 108 are connected in series between a complement bit line BLB(X) in the $X^{th}$ column and ground. In particular, the source of transistor 104 is coupled to the complement bit line BLB(X), the drain of transistor 104 is coupled to the source of transistor 108 at node 112, and the drain of transistor 108 is coupled to ground.

In general, ROM cell 100 is a basic cell structure that may be selectively programmed, e.g., during fabrication, by coupling each of nodes 110 and 112 to the true bit line BL(X), complement bit line BLB(X), or ground using, for example, metal lines or vias. The selective programming, which is described in further detail below, enables ROM cell 100 to store any of four bit-pair combinations (i.e., 00, 01, 10, or 11).

In operation and as more-fully described below, reading of the first programmed bit of memory cell 100 is controlled by a $Y^{th}$ word line WL(Y) of the memory array, which controls the gates of transistors 102 and 104, and reading of the second programmed bit of memory cell 100 is controlled by a $(Y+1)^{th}$ word line WL(Y+1) of the memory array, which controls the gates of transistors 106 and 108. Prior to reading, both the true bit line BL(X) and the complement bit line BLB(X) are charged to a high reference voltage.

Each bit value is detected by a sense amplifier (not shown) that detects the difference between the true bit line BL(X) and the complement bit line BLB(X). For this discussion, it is assumed that a value of zero is detected when the true bit line BL(X) is discharged and the complement bit line BLB(X) is high, and a value of one is detected when the true bit line BL(X) is high and the complement bit line BLB(X) is discharged.

Figure 2:
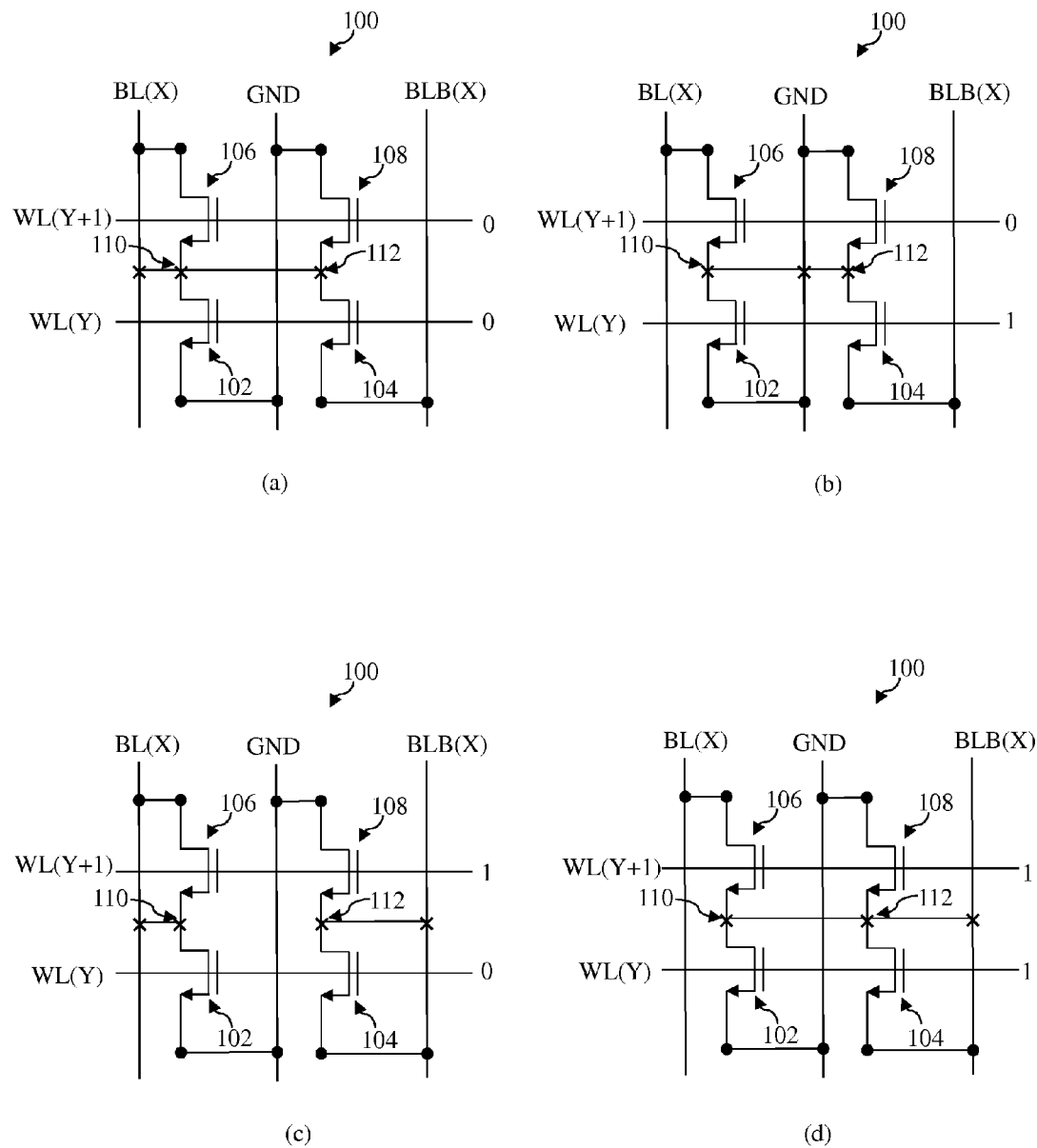
FIGS. 2(a)-(d) show four simplified schematic diagrams illustrating four different programmed configurations of the ROM cell in FIG. 1.

FIGS. 2(a)-(d) show four simplified schematic diagrams illustrating four different programmed configurations of ROM cell 100. In FIG. 2(a), ROM cell 100 is programmed to store (i) a first bit value of zero and (ii) a second bit value of zero by (a) coupling node 110 to the true bit line BL(X) and (b) coupling node 112 to the true bit line BL(X). When word line WL(Y) is driven high, transistor 102 turns on, and true bit line BL(X) discharges through transistor 102 toward ground. As a result, true bit line BL(X) goes low, while complement bit line BLB(X) stays high (i.e., a value of zero is read). Note that transistor 104 is coupled to both the true bit line BL(X) and the complement bit line BLB(X). However, transistor 104 will not turn on until the voltage difference Vgs between the gate and source of transistor 104 is greater than the threshold voltage Vtn of transistor 104. Therefore, the complement bit line BLB(X) will not discharge through transistor 104 until after the true bit line BL(X) has discharged by an amount equal to the threshold voltage Vtn of transistor 104. When word line WL(Y+1) is driven high, transistors 106 and 108 turn on, and true bit line BL(X) discharges through transistor 108 toward ground. As a result, true bit line BL(X) goes low, while complement bit line BLB(X) stays high (i.e., a value of zero is read).

In FIG. 2(b), ROM cell 100 is programmed to store (i) a first bit value of one and (ii) a second bit value of zero by (a) coupling node 112 to ground and (b) coupling node 110 to ground. When word line WL(Y) is driven high, turning on transistors 102 and 104, complement bit line BLB(X) discharges through transistor 104 toward ground. As a result, true bit line BL(X) stays high, while complement bit line BLB(X) goes low (i.e., a value of one is read). When word line WL(Y+1) is driven high, turning on transistors 106 and 108, true bit line BL(X) discharges through transistor 106 toward ground. As a result, true bit line BL(X) goes low, while complement bit line BLB(X) stays high (i.e., a value of zero is read).

In FIG. 2(c), ROM cell 100 is programmed to store (i) a first bit value of zero and (ii) a second bit value of one by (a) coupling node 110 to the true bit line BL(X) and (b) coupling node 112 to the complement bit line BLB(X). When word line WL(Y) is driven high, turning on transistors 102 and 104, true bit line BL(X) discharges through transistor 102 toward ground. As a result, true bit line BL(X) goes low, while complement bit line BLB(X) stays high (i.e., a value of zero is read). When word line WL(Y+1) is driven high, turning on transistors 106 and 108, complement bit line BLB(X) discharges through transistor 108 toward ground. As a result, true bit line BL(X) stays high, while complement bit line BLB(X) goes low (i.e., a value of one is read).

In FIG. 2(d), ROM cell 100 is programmed to store (i) a first bit value of one and (ii) a second bit value of one by (a) coupling node 110 to the complement bit line BL(X) and (b) coupling node 112 to the complement bit line BLB(X). When word line WL(Y) is driven high, turning on transistors 102 and 104, complement bit line BLB(X) discharges through transistor 102 toward ground. As a result, true bit line BL(X) stays high, while complement bit line BLB(X) goes low (i.e., a value of one is read). When word line WL(Y+1) is driven high, transistor 108 turns on, and complement bit line BLB (X) discharges through transistor 108 toward ground. As a result, true bit line BL(X) stays high, while complement bit line BLB(X) goes low (i.e., a value of one is read). Note that transistor 106 is coupled to both the true bit line BL(X) and the complement bit line BLB(X). However, transistor 106 will not turn on until the voltage difference Vgs between the gate and source of transistor 106 is greater than the threshold voltage Vtn of transistor 106. Therefore, the true bit line BL(X) will not discharge through transistor 106 until after the complement bit line BLB(X) has discharged by an amount equal to the threshold voltage Vtn of transistor 106.

Note that, in each of the programmed configurations of ROM cell 100, each time a bit value is read, either the true bit line BL(X) or the complement bit line BLB(X) is discharged through only a single transistor. As a result, the discharge rate of each of the true bit line BL(X) and the complement bit line BLB(X) is faster than conventional ROM cells that discharge bit lines through multiple transistors connected in series. Nevertheless, all four transistors are used to implement the four bit-pair combinations and are accommodated in the area which is governed by metal lines and not by device size. Therefore, there are no unused (i.e., overhead) transistors that increase space requirements on the chip.

Figure 3:
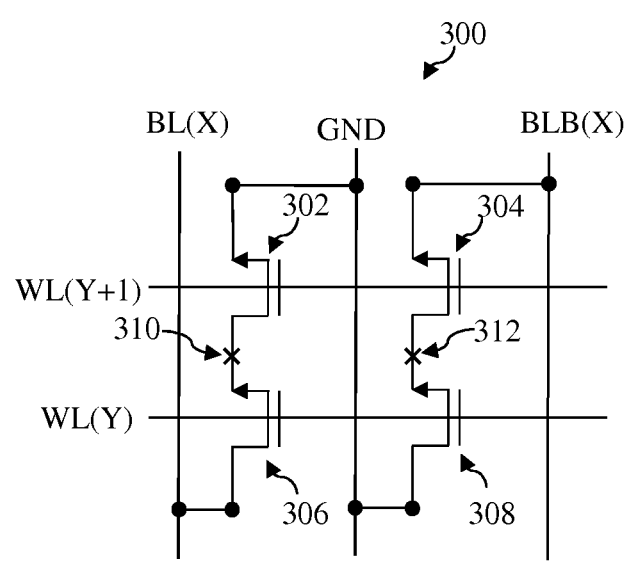
FIG. 3 shows a simplified schematic diagram of an inverted ROM cell according to one embodiment of the disclosure.

FIG. 3 shows a simplified schematic diagram of an inverted ROM cell 300 according to one embodiment of the disclosure. With the exception of word lines WL(Y) and WL(Y+1), ROM cell 300 is obtained by inverting ROM cell 100 of FIG. 1 about an axis extending between nodes 110 and 112. Thus, the gates of transistors 306 and 308 are controlled by the $Y^{th}$ word line WL(Y) of the memory array to read the first programmed bit of memory cell 300, and the gates of transistors 302 and 304 are controlled by the $(Y+1)^{th}$ word line WL(Y+1) of the memory array to read the second programmed bit of memory cell 300.

Figure 4:
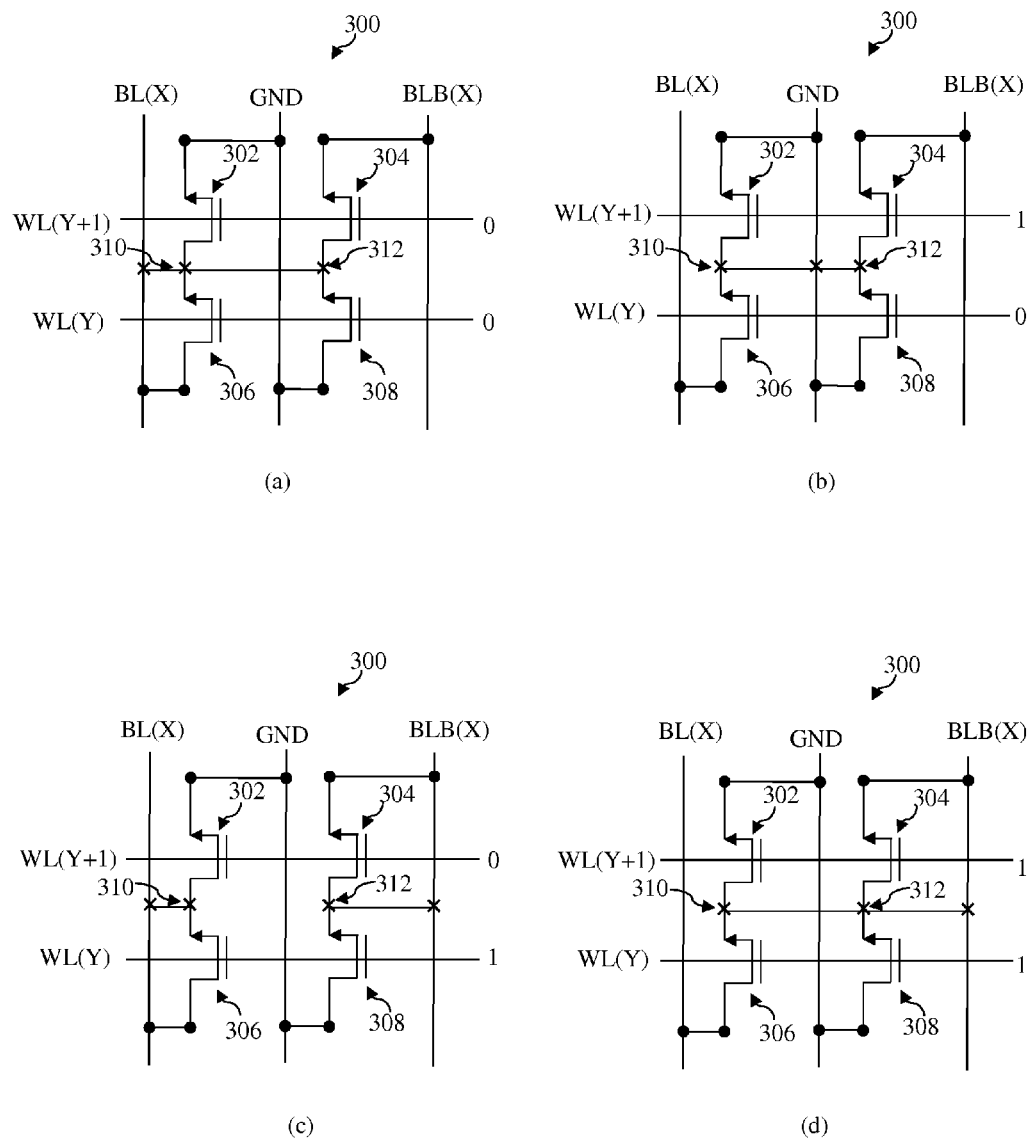
FIGS. 4(a)-(d) show four simplified schematic diagrams illustrating four different programmed configurations of the ROM cell in FIG. 3.

FIGS. 4(a)-(d) show four simplified schematic diagrams illustrating four different programmed configurations of ROM cell 300. FIG. 4(a) is obtained by inverting the programmed configuration in FIG. 2(a), and as a result, both the first and the second bits stored in ROM cell 300 have a value of zero. FIG. 4(b) is obtained by inverting the programmed configuration in FIG. 2(b), and as a result, the first bit stored in ROM cell 300 has a value of one and the second bit stored in ROM cell 300 has a value of zero. FIG. 4(c) is obtained by inverting the programmed configuration in FIG. 2(c), and as a result, the first bit stored in ROM cell 300 has a value of one and the second bit stored in ROM cell 300 has a value of zero. FIG. 4(d) is obtained by inverting the programmed configuration in FIG. 2(d), and as a result, both the first and the second bits stored in ROM cell 300 have a value of one.

Figure 5:
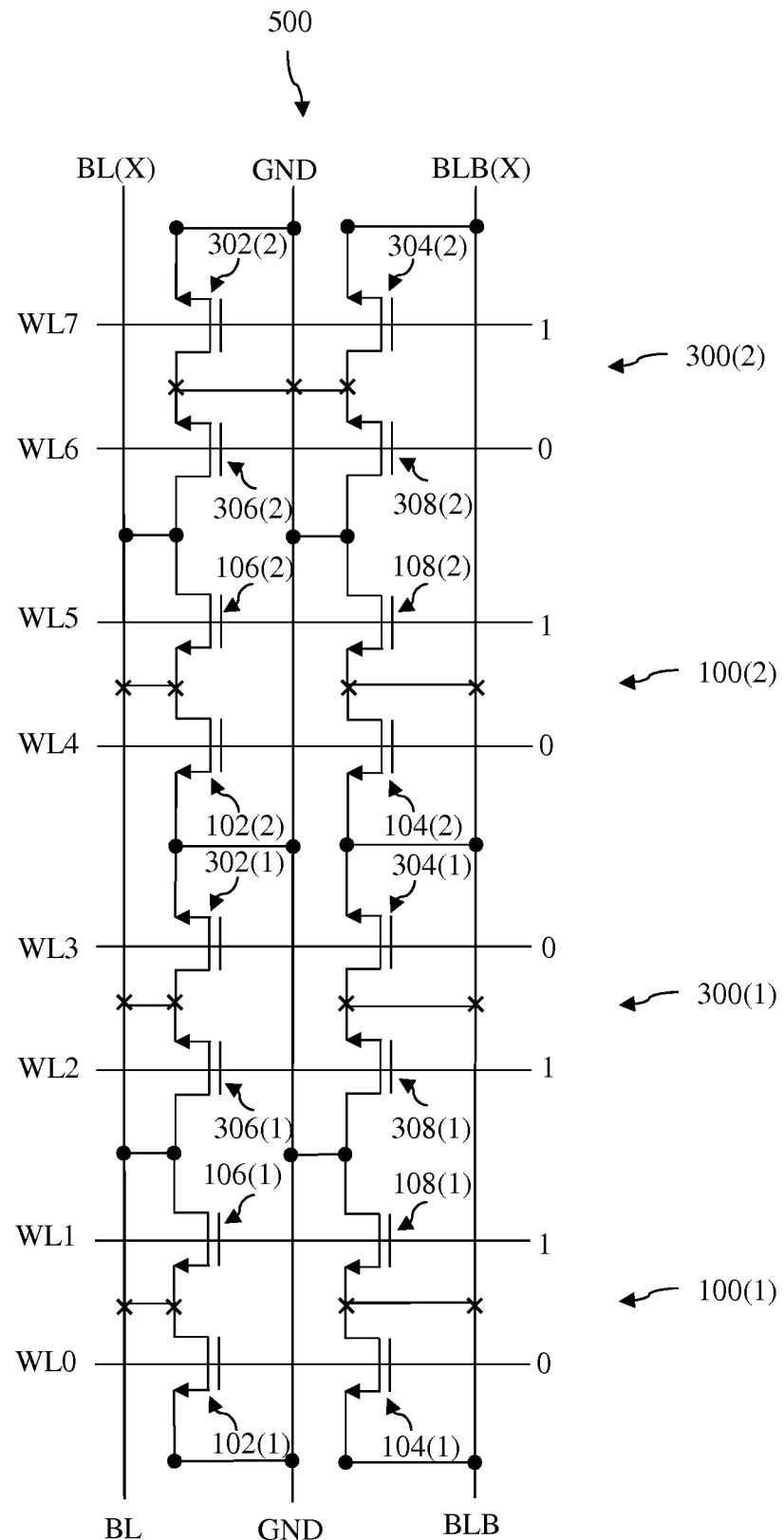
FIG. 5 shows a simplified schematic diagram of a column of a memory array according to one embodiment of the disclosure.

FIG. 5 shows a simplified schematic diagram of a column 500 of a memory array according to one embodiment of the disclosure. Column 500 is formed by alternating programmed instances of ROM cell 100 of FIG. 1, which are labeled 100(1) and 100(2), and inverted ROM cell 300 of FIG. 3, which are labeled 300(1) and 300(2). ROM cell 100(1) is programmed as shown in FIG. 2(c) to store values of zero and one for word lines WL0 and WL1, respectively. ROM cell 300(1) is programmed as shown in FIG. 4(c) to store values of one and zero for word lines WL2 and WL3, respectively. ROM cell 100(2) is programmed as shown in FIG. 2(c) to store values of zero and one for word lines WL4 and WL5, respectively. ROM cell 300(2) is programmed as shown in FIG. 4(b) to store values of zero and one for word lines WL6 and WL7, respectively.

The instances of ROM cell 100 and inverted ROM cell 300 are abutted together as follows: (i) the drains of transistors 306(1) and 308(1) of ROM cell 300(1) are coupled to the drains of transistors 106(1) and 108(1) of ROM cell 100(1), respectively; (ii) the sources of transistors 102(2) and 104(2) of ROM cell 100(2) are coupled to the sources of transistors 302(1) and 304(1) of ROM cell 300(1), respectively; and (iii) the drains of transistors 306(2) and 308(2) of ROM cell 300 (2) are coupled to the drains of transistors 106(2) and 108(2) of ROM cell 100(2), respectively.

The abutment of the instances of ROM cell 100 and inverted ROM cell 300 together enables column 500 to have one continuous active region (i.e., the region where the sources and the drains are located). In other words, there is no break between (i) the sources or drains of one ROM cell and (ii) the sources or drains of the adjacent ROM cell. Avoiding breaks between adjacent ROM cells as shown in FIG. 5 enables the ROM cells to be placed closer together, thereby occupying less space on a chip. Further, by alternating the instances of ROM cell 100 and inverted ROM cell 300 and avoiding breaks between adjacent ROM cells as shown in FIG. 5, an inadvertent short between two adjacent ROM cells can be prevented, wherein the inadvertent short would result in both the true bit line and the complement bit line discharging during a single read cycle.

Figure 6:
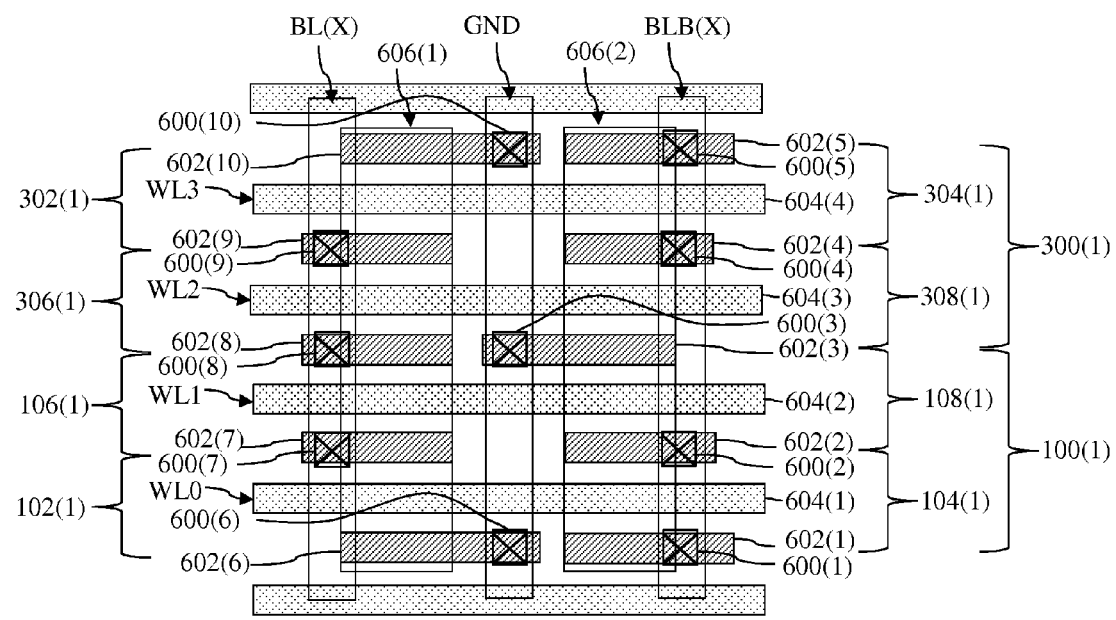
FIG. 6 shows a cross-sectional view of the first two ROM cells of the column in FIG. 5.

FIG. 6 shows a cross-sectional view of the first two ROM cells 100(1) and 300(1) of column 500 of FIG. 5. Note that ROM cells 100(1) and 300(1) in FIG. 6 are programmed in the same manner as ROM cells 100(1) and 300(1) in FIG. 5. As shown, transistor 102(1) of ROM cell 100(1) is formed from gate 604(1), a source terminal 602(6), and a drain terminal 602(7), and source terminal 602(6) is coupled to ground via contact 600(6). Transistor 104(1) of ROM cell 100(1) is formed from gate 604(1), source terminal 602(1), and drain terminal 602(2), and source terminal 602(1) is coupled to the complement bit line BLB(X) via contact 600(1).

Transistor 106(1) of ROM cell 100(1) is formed from gate 604(2), source terminal 602(7), which also serves as the drain terminal for transistor 102(1) as described above, and drain terminal 602(8), which is coupled to the true bit line BL(X) via contact 600(8). Similarly, transistor 108(1) of ROM cell 100(1) is formed from gate 604(2), source terminal 602(2), which also serves as the drain terminal for transistor 104(1) as described above, and drain terminal 602(3), which is coupled to ground via contact 600(3). Note that ROM cell 100(1) is programmed as shown in FIG. 2(c) by coupling (i) node 110, which is formed by shared terminal 602(7), to the true bit line BL(X) via contact 600(7) and (ii) node 112, which is formed by shared terminal 602(2), to the complement bit line BLB (X) via contact 600(2).

ROM cell 300(1) is abutted to ROM cell 100(1) via (i) drain terminal 602(3), which is shared by transistor 108(1) of ROM cell 100(1) and transistor 308(1) of ROM cell 300(1), and (ii) drain terminal 602(8), which is shared by transistor 106(1) of ROM cell 100(1) and transistor 306(1) of ROM cell 300(1). The abutment of ROM cells 100(1) and 300(1) result in two continuous active regions 606(1) and 606(2) (also known as diffusion areas). Along with drain terminal 602(8), transistor 306(1) of ROM cell 300(1) is formed from gate 604(3) and source terminal 602(9), and along with drain terminal 602(3), transistor 308(1) of ROM cell 300(1) is formed from gate 604(3) and source terminal 602(4).

Transistor 302(1) of ROM cell 300(1) is formed from gate 604(4), drain terminal 602(9), which also serves as the source terminal for transistor 306(1) as described above, and source terminal 602(10), which is coupled to ground via contact 600(10). Similarly, transistor 304(1) of ROM cell 300(1) is formed from gate 604(4), drain terminal 602(4), which also serves as the source terminal for transistor 308(1) as described above, and source terminal 602(5), which is coupled to the complement bit line BLB(X) via contact 600 (5). Note that ROM cell 300(1) is programmed as shown in FIG. 4(c) by coupling (i) node 310, which is formed by shared terminal 602(9), to the true bit line BL(X) via contact 600(9) and (ii) node 312, which is formed by shared terminal 602(4), to the complement bit line BLB(X) via contact 600(4).

Although ROM cells of the disclosure have been described as being implemented with n-type transistors, ROM cells of the disclosure are not so limited. According to alternative embodiments, ROM cells of the disclosure may be implemented using p-type transistors. When using p-type transistors, the word line would be driven from high to low during a read operation.

Although the read operation described above in relation to ROM cell 100 of FIG. 1 suggested that a read was performed by (i) pre-charging the true bit line BL(X) and complement bit line BLB(X) to a high voltage reference, and (ii) discharging one of the true bit line BL(X) and complement bit line BLB (X), embodiments of the disclosure are not so limited. According to alternative embodiments, the true bit line BL(X) and complement bit line BLB(X) can be pre-set to a low-voltage reference, and one of the true bit line BL(X) and complement bit line BLB(X) can be driven high during a read operation. At least some such embodiments may be implemented by replacing the ground between the true bit line BL(X) and complement bit line BLB(S) with a high-voltage reference.

Although embodiments of the disclosure were described as being programmed during manufacturing using, for example, metals and vias, embodiments of the present disclosure are not so limited. According to alternative embodiments, ROM cells of the disclosure may be implemented using other ROM technologies such as programmable ROM (PROM), erasable programmable ROM (EPROM), and electrically erasable programmable ROM (EEPROM). Further, such alternative embodiments may be implemented using, for example, controllable switches (not shown) to selectively program the ROM cells.

According to alternative embodiments of the disclosure, a value of one, rather than zero, could be detected when the true bit line BL(X) is discharged and the complement bit line BLB(X) is high, and a value of zero, rather than one, could be detected when the true bit line BL(X) is high and the complement bit line BLB(X) is discharged.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An apparatus comprising a read-only memory cell comprising:
    first and second transistors connected at a first node and in series between a true bit line and a voltage reference; and
    third and fourth transistors connected at a second node and in series between a complement bit line and the voltage reference, wherein (i) gates of the first and third transistors are connected to a first word line and (ii) gates of the second and fourth transistors are connected to a second word line, wherein the read-only memory cell is configurable by:
    connecting the first node to one of the true bit line, the complement bit line, and the voltage reference via a path that does not pass through the first and second transistors; and
    connecting the second node to one of the true bit line, the complement bit line, and the voltage reference via a path that does not pass through the third and fourth transistors.

2. The apparatus of claim 1, wherein the read-only memory cell stores two bits.

3. The apparatus of claim 1, wherein the read-only memory cell is configurable to store any possible combination of the two bits.

4. The apparatus of claim 1, wherein the apparatus comprises an integrated circuit.

5. The apparatus of claim 1, wherein:
the first node comprises a transistor terminal shared between the first and second transistors; and
the second node comprises a transistor terminal shared between the third and fourth transistors.

6. The apparatus of claim 1, wherein:
the first transistor is connected between the first node and the voltage reference;
the second transistor is connected between the true bit line and the first node;
the third transistor is connected between the second node and the complement bit line; and
the fourth transistor is connected between the voltage reference and the second node.

7. An apparatus comprising a read-only memory cell comprising:
first and second transistors connected at a first node and in series between a true bit line and a voltage reference; and
third and fourth transistors connected at a second node and in series between a complement bit line and the voltage reference, wherein (i) gates of the first and third transistors are connected to a first word line and (ii) gates of the second and fourth transistors are connect to a second word line, wherein:
the first node is connected to one of the true bit line, the complement bit line, and the voltage reference via a path that does not pass through the first and second transistors; and
the second node is connected to one of the true bit line, the complement bit line, and the voltage reference via a path that does not pass through the third and fourth transistors.

8. The apparatus of claim 7, wherein:
the first node comprises a transistor terminal shared between the first and second transistors; and
the second node comprises a transistor terminal shared between the third and fourth transistors.

9. An apparatus comprising a read-only memory cell comprising:
first and second transistors connected at a first node and in series between a true bit line and a voltage reference; and
third and fourth transistors connected at a second node and in series
between a complement bit line and the voltage reference, wherein (i) gates of the first and third transistors are connected a first word line and (ii) gates of the second and fourth transistors are connected to a second word line, wherein the apparatus comprises a second read-only memory cell comprising:
fifth and sixth transistors connected at a third node and in series between the true bit line and the voltage reference; and
seventh and eighth transistors connected in series at a fourth node and between the complement bit line and the voltage reference, wherein gates of the fifth and seventh transistors are connected to a third word line and gates of the sixth and eighth transistors are connected to a fourth word line.

10. The apparatus of claim 9, wherein the second read-only memory cell is an inverted version of the first read-only memory cell.

11. The apparatus of claim 9, wherein:
one of the first and second transistors shares a first transistor terminal with one of the fifth and sixth transistors; and
one of the third and fourth transistors shares a second transistor terminal with one of the seventh and eight transistors.

12. The apparatus of claim 9, wherein the read-only memory cell and the second read-only memory cell are coupled together to form a continuous active region.

13. The apparatus of claim 10, comprising a plurality of instances of the first read-only memory cell interleaved with a plurality of instances of the second read-only memory cell.

14. The apparatus of claim 10, wherein:
the second transistor is connected to the fifth transistor and the true bit line at a fifth node; and
the fourth transistor is connected to the seventh transistor and the voltage reference at a sixth node.

15. The apparatus of claim 11, wherein the first transistor terminal is coupled to the true bit line and the second transistor terminal is coupled to the voltage reference.

16. The apparatus of claim 11, wherein the first transistor terminal is coupled to the voltage reference and the second transistor terminal is coupled to the complement bit line.

17. A method for programming a read-only memory cell, the ROM cell comprising:
first and second transistors connected at a first node in series between a true bit line and a voltage reference; and
third and fourth transistors connected at a second node in series between a complement bit line and the voltage reference, wherein (i) gates of the first and third transistors are connected to a first word line and (ii) gates of the second and fourth transistors are connected to a second word line, wherein the method comprises:
(a) connecting the first node to one of the true bit line, the complement bit line, and the voltage reference via a path that does not pass through the first and second transistors; and
(b) connecting the second node to one of the true bit line, the complement bit line, and the voltage reference via a path that does not pass through the third and fourth transistors.

18. The method of claim 17, wherein the apparatus comprises a second read-only memory cell comprising:
fifth and sixth transistors connected at a third node and in series between the true bit line and the voltage reference; and
seventh and eighth transistors connected at a fourth node and in series between the complement bit line and the voltage reference, wherein gates of the fifth and seventh transistors are connected to a third word line and gates of the sixth and eighth transistors are connected to a fourth word line, wherein the method further comprises:
(c) connecting the third node to one of the true bit line, the complement bit line, and the voltage reference via a path that does not pass through the fifth and sixth transistors; and
(d) connecting the fourth node to one of the true bit line, the complement bit line, and the voltage reference via a path that does not pass through the seventh and eight transistors.

19. The method of claim 17, comprising configuring the read-only memory cell to store a combination of two bits.

20. The method of claim 18, wherein the second read-only memory cell is an inverted version of the first read-only memory cell.

* * * * *